US008217507B1

(12) United States Patent
Galloway et al.

(10) Patent No.: US 8,217,507 B1
(45) Date of Patent: Jul. 10, 2012

(54) EDGE MOUNT SEMICONDUCTOR PACKAGE

(75) Inventors: Jesse E. Galloway, Chandler, AZ (US);
Bob-Shih Wei Kuo, Chandler, AZ (US);
Ahmer Syed, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 223 days.

(21) Appl. No.: 12/692,522

(22) Filed: Jan. 22, 2010

(51) Int. Cl.
*H05K 1/11* (2006.01)
*H05K 1/14* (2006.01)

(52) U.S. Cl. ......... 257/690; 257/E23.065; 257/E23.177; 257/E23.06; 257/784; 257/786; 257/787; 257/788; 257/668; 257/723; 257/685; 257/678; 257/738; 257/737; 257/693

(58) Field of Classification Search .......... 257/690, 257/784, 786, 787, 788, 668, 723, 685, E23.065, 257/E23.177, 678, E23.06, 738, 737, 693
See application file for complete search history.

(56) References Cited

U.S. PATENT DOCUMENTS

| 6,320,251 | B1 | 11/2001 | Glenn | |
|---|---|---|---|---|
| 6,358,772 | B2 | 3/2002 | Miyoshi | |
| 6,841,855 | B2* | 1/2005 | Jaeck et al. | 257/668 |
| 7,148,087 | B2* | 12/2006 | Salta, III | 438/126 |
| 7,154,171 | B1 | 12/2006 | Yoshida | |
| 7,335,973 | B2* | 2/2008 | Manepalli et al. | 257/686 |
| 7,606,048 | B2* | 10/2009 | Cady et al. | 361/767 |
| 7,736,044 | B2* | 6/2010 | Chew et al. | 362/612 |
| 2005/0012194 | A1* | 1/2005 | Jaeck | 257/686 |
| 2005/0041403 | A1* | 2/2005 | Cady et al. | 361/749 |
| 2005/0150813 | A1 | 7/2005 | Thompson et al. | |
| 2005/0224993 | A1* | 10/2005 | Manepalli et al. | 257/787 |
| 2006/0008949 | A1* | 1/2006 | Salta, III | 438/125 |
| 2006/0049495 | A1* | 3/2006 | Hazeyama et al. | 257/678 |
| 2006/0073624 | A1* | 4/2006 | Manepalli et al. | 438/26 |
| 2006/0138630 | A1* | 6/2006 | Bhakta | 257/686 |
| 2006/0141749 | A1* | 6/2006 | Manepalli et al. | 438/455 |
| 2006/0228830 | A1* | 10/2006 | Lin | 438/109 |
| 2006/0278962 | A1 | 12/2006 | Gibson | |
| 2006/0286717 | A1* | 12/2006 | Solberg et al. | 438/113 |
| 2007/0001299 | A1* | 1/2007 | Kikuchi et al. | 257/723 |
| 2007/0070611 | A1* | 3/2007 | Koh | 361/764 |
| 2008/0171402 | A1* | 7/2008 | Karnezos | 438/15 |
| 2010/0025844 | A1* | 2/2010 | Yamazaki | 257/693 |

\* cited by examiner

*Primary Examiner* — A O Williams
(74) *Attorney, Agent, or Firm* — Stetina Brunda Garred & Brucker

(57) ABSTRACT

A semiconductor package which is structured to allow for the edge mounting thereof in a vertical mount orientation. The semiconductor package comprises a flexible substrate or "flex circuit." The flexible substrate includes a conductive pattern disposed on a first surface thereof, and a plurality of conductive pads or terminals disposed on a second surface thereof which is disposed in opposed relation to the first surface. Mounted to the first surface of the flexible substrate are one or more electronic components such as semiconductor dies. The semiconductor die(s) is/are electrically connected to the conductive pattern, and thereafter covered or encapsulated by a package body applied to a portion of the first surface of the flexible substrate. That portion of the flexible substrate including the conductive pads or terminals formed on the second surface thereof is thereafter folded and adhered to a portion of the package body through the use of a suitable adhesive.

20 Claims, 5 Drawing Sheets

EDGE MOUNT SEMICONDUCTOR PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package including a flexible substrate formed from a flex tape and folded in a manner which allows the completed semiconductor package to be edge mounted in a vertical mount orientation.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die attach pad or die pad of the leadframe also remains exposed within the package body. In other semiconductor packages, the metal leadframe is substituted with a laminate substrate to which the semiconductor die is mounted and which includes pads or terminals for mimicking the functionality of the leads and establishing electrical communication with another device.

Once the semiconductor dies have been produced and encapsulated in the semiconductor packages described above, they may be used in a wide variety of electronic devices. The variety of electronic devices utilizing semiconductor packages has grown dramatically in recent years. These devices include cellular phones, portable computers, gaming systems, etc. Each of these devices typically includes a printed circuit board on which a significant number of such semiconductor packages are secured to provide multiple electronic functions. These electronic devices are typically manufactured in reduced sizes and at reduced costs, which results in increased consumer demand. Accordingly, not only are semiconductor dies highly integrated, but also semiconductor packages are highly miniaturized with an increased level of package mounting density.

Even though semiconductor packages have been miniaturized, space on a printed circuit board remains limited and precious. Thus, there is a need to find a semiconductor package design to maximize the number of semiconductor packages that may be integrated into an electronic device, yet minimize the space needed to accommodate these semiconductor packages. One method to minimize space needed to accommodate the semiconductor packages is to stack the semiconductor packages on top of each other, or to stack individual semiconductor devices or other devices within the package body of the semiconductor package. However, these and other existing stacking solutions possess certain deficiencies which detract from their overall utility. In this regard, the structural attributes of package stacks including two or more semiconductor packages often results in electrical paths of increased length in the package stack, thus deteriorating the electrical performance of the semiconductor packages therein. Additionally, when attempting to integrate a large number of devices such as memory chips into a vertical stack within a single semiconductor package, test yield loss typically becomes higher as more such devices are assembled in a single package. As a result, it becomes desirable to use multiple packages which each contain a subset of the memory chips or devices to be integrated vertically. Further, many semiconductor package stacking approaches result in excessive increases in the area and/or thickness or the package stack, and thus are not suitable for portable electronic/communication devices that are becoming gradually lighter in weight and smaller in size and thickness. The present invention addresses these and other deficiencies, and provides a packaging solution wherein the semiconductor package is uniquely structured to allow for the edge mounting thereof in a vertical mount orientation, thus allowing for a substantial increase in the mounting density of semiconductor packages of such design upon an underlying substrate such as a printed circuit board or PCB. These, as well as other features and attributes of the present invention will be discussed in more detail below.

BRIEF SUMMARY OF THE INVENTION

In accordance with the present invention, there is provided a uniquely configured semiconductor package which is structured to allow for the edge mounting thereof in a vertical mount orientation, and a related method for fabricating such semiconductor package. The semiconductor package comprises a flexible substrate or "flex circuit" which, in one embodiment of the present invention, is fabricated from flex tape. The flexible substrate includes a conductive pattern disposed on a first surface thereof, and a plurality of conductive pads or terminals disposed on a second surface thereof which is disposed in opposed relation to the first surface. Mounted to the first surface of the flexible substrate are one or more electronic components such as semiconductor dies. The semiconductor die(s) is/are electrically connected to the conductive pattern, and thereafter covered or encapsulated by a package body applied to a portion of the first surface of the flexible substrate. That portion of the flexible substrate including the conductive pads or terminals formed on the second surface thereof is thereafter folded and adhered to a portion of the package body through the use of a suitable adhesive. The folding of the flexible substrate in the aforementioned manner causes that portion including the conductive terminals disposed thereon to extend in a prescribed angular orientation (e.g., approximately 90°) relative to the remainder of the flexible substrate.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
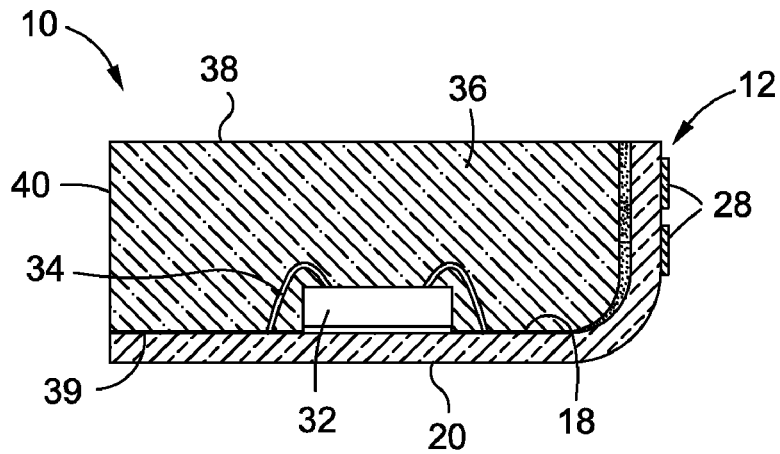
FIG. 1 is a side-elevational view of a semiconductor package constructed in accordance with the present invention, the internal semiconductor dies of the semiconductor package being shown in phantom for illustrative purposes.
Figure 2:
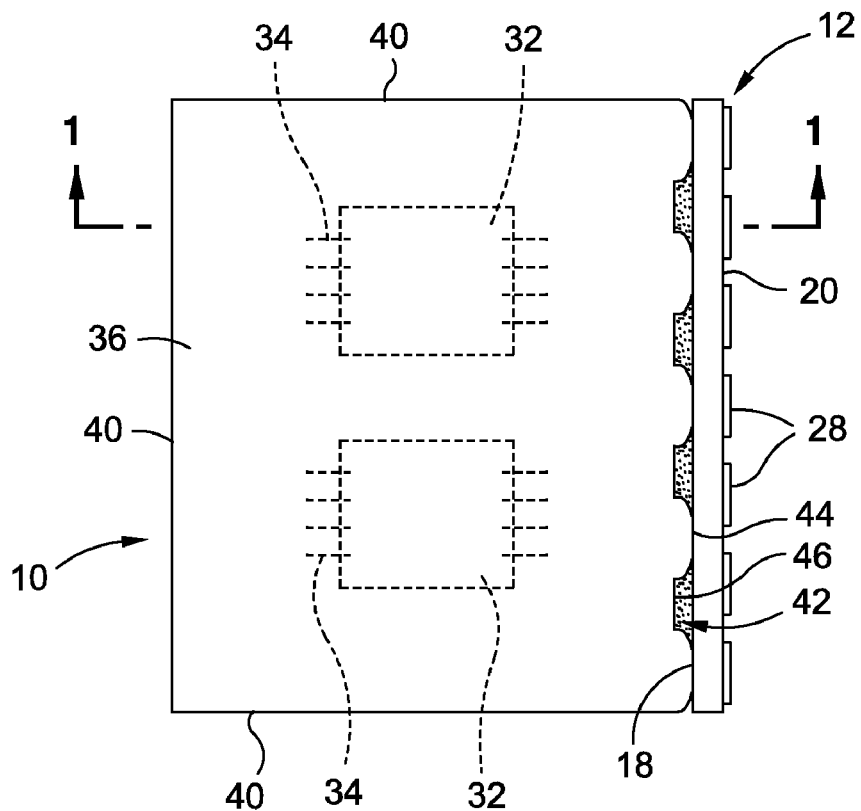
FIG. 2 is a top plan view of a semiconductor package shown in FIG. 1, the internal semiconductor dies of the semiconductor package being shown in phantom for illustrative purposes.
Figure 3:
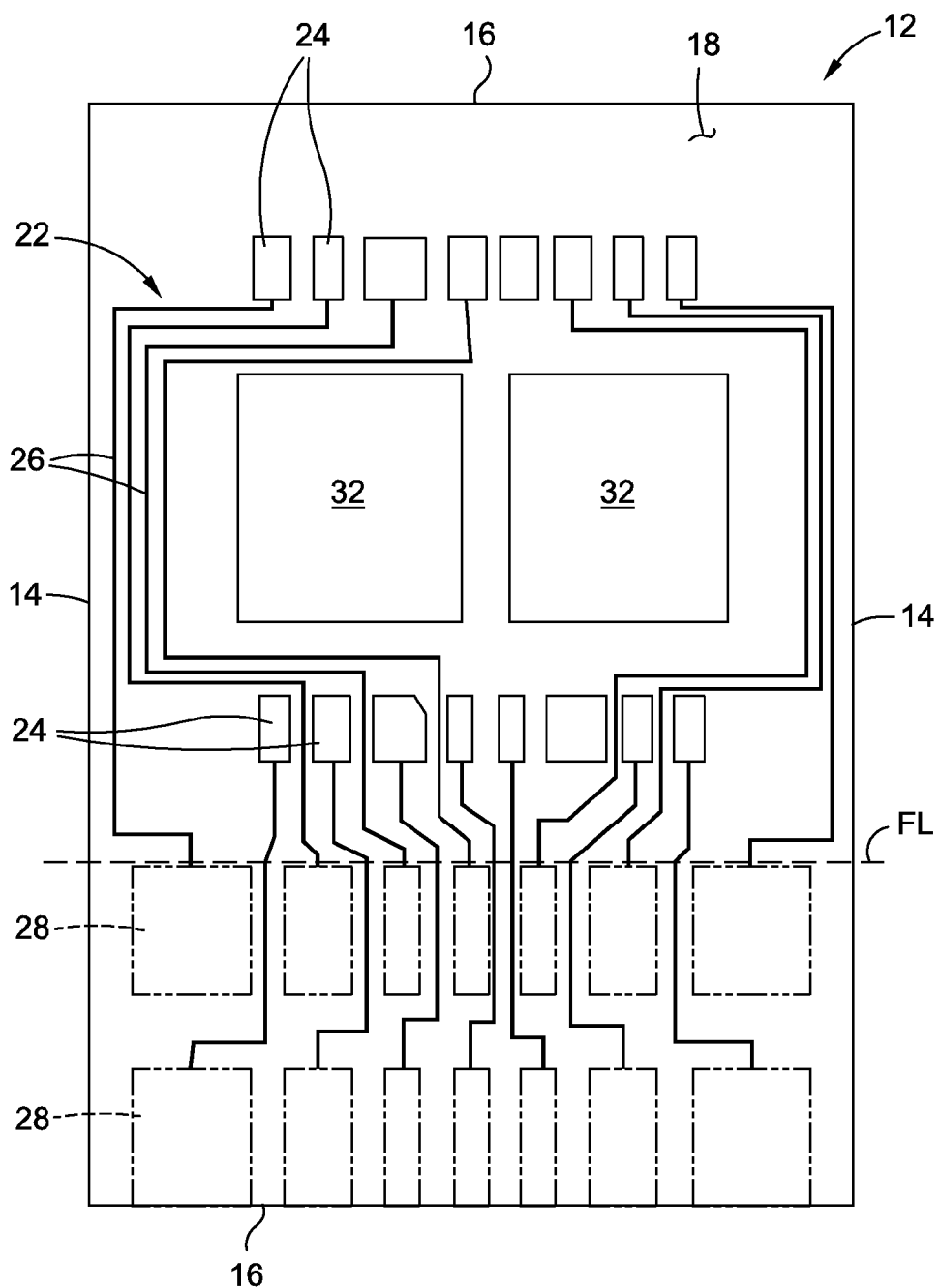
FIG. 3 is a top plan view of the flexible substrate or flex circuit of the semiconductor package of the present invention, the flexible substrate being shown as having the semiconductor dies of the semiconductor package mounted and electrically connected thereto, but prior to the folding thereof around a portion of the package body of the semiconductor package.

Referring now to the drawings wherein the showings are for purposes of illustrating a preferred embodiment of the present invention only, and not for purposes of limiting the same, FIGS. 1 and 2 depict a semiconductor package 10 constructed in accordance with the present invention. The semiconductor package 10 includes a flexible substrate 12 or "flex circuit" which, in one embodiment of the present invention, may be fabricated from flex tape. As best seen in FIG. 3, the flexible substrate 12 has a generally quadrangular (e.g., rectangular) configuration, defining an opposed pair of longitudinally extending peripheral edge segments 14 and an opposed pair of laterally extending peripherally edge segments 16. In addition, the flexible substrate 12 defines a generally planar first (top) surface 18 and an opposed, generally planar second (bottom) surface 20. The flexible substrate 12 further includes a conductive pattern 22 which is disposed on the first surface 18 thereof. As is most easily seen in FIG. 3, the conductive pattern 22 comprises a plurality of conductive pads 24 and a plurality of elongate, conductive traces 26 which are arranged on the first surface 18 in a prescribed pattern.

The flexible substrate 12 of the semiconductor package 10 further comprises a plurality of conductive terminals 28 which are formed on a portion of the second surface 20 thereof. More particularly, as further shown in FIG. 3, the conductive terminals 28 are preferably formed on that portion of the second surface 20 which extends between one of the laterally extending peripheral edge segments 16 and a fold line FL which extends generally perpendicularly between the longitudinally extending peripheral edge segments 14. In FIG. 3, the fold line is depicted as being located closer to one of the laterally extending peripheral edge segments 16 than the other, the terminals 28 being located between the fold line FL and the peripheral edge segment 16 of the pair disposed closest thereto. While the majority of the conductive pattern 22 on the first surface 18 is oriented between the fold line FL and peripheral edge segment 16 of the pair disposed furthest therefrom, portions of certain ones of the conductive traces 26 of the conductive pattern 22 are located on the first surface 18 so as to reside between the fold line FL and that peripheral edge segment 16 disposed closest thereto. As shown in FIGS. 5A-5D, in the flexible substrate 12, the electrical connection between the conductive pattern 22 and the conductive terminals 28 is facilitated by a plurality of conductive vias 30 which extend through the flexible substrate 12 and electrically connect certain ones of the conductive traces 26 of the conductive pattern 22 to corresponding ones of the conductive terminals 28. Those of ordinary skill in the art will recognize that the number and arrangement of the conductive pads and traces 24, 26 included in the conductive pattern 22, and the number and arrangement of the conductive terminals 28 as shown in FIG. 3 is exemplary only, and may be varied without departing from the spirit and scope of the present invention.

In addition to the flexible substrate 12, the semiconductor package 10 comprises at least one, and preferably a plurality of electronic components 32 which are mounted to the first surface 18 of the flexible substrate 12 and electrically connected to the conductive pattern 22 thereof. As shown in FIGS. 1, 2 and 5A-5D, the electrical connection of the electronic components 32 to the conductive pattern 22 is preferably facilitated by the use of conductive wires 34, each of which extends between a contact of a corresponding one of the electronic components 32 and a respective one of the conductive pads 24 of a conductive pattern 22. In FIG. 3, the electronic components 32 are shown as being disposed in side-by-side relation to each other. However, those of ordinary skill in the art will recognize that the number and arrangement of the electronic components 32 electrically connected to the flexible substrate 12 and included in the semiconductor package 10 may be varied from that shown in FIG. 3 without departing from the spirit and scope of the present invention. Additionally, it is contemplated that the electronic components 32 may include semiconductor dies, flash memories, mixed signal devices, analog devices, logic devices, and equivalents thereof provided in any one of a multiplicity of different combinations. In this regard, the present invention is not intended to be limited to any specific type of device for the electronic components 32. However, irrespective of the number and arrangement of the electronic components 32 included in the semiconductor package 10, it is contemplated that such electronic component(s) 32 be mounted to that portion of the first surface 18 of the flexible substrate 12 which is disposed between the fold line FL and that laterally extending peripheral edge segment 16 disposed furthest from the fold line FL in the manner also shown in FIG. 3.

In the semiconductor package 10, the electronic component(s) 32 and the conductive wires 34 used to electrically connect the same to the conductive pattern 22 of the flexible substrate 12 are covered by an encapsulant material which ultimately hardens into a package body 36 of the semiconductor package 10. The package body 36 has a generally quadrangular configuration and, as best shown in FIGS. 4 and 5A-5D, is preferably formed so as to cover the entirety of that portion of the first surface 18 of the flexible substrate 12 which extends between the fold line FL and that laterally extending peripheral edge segment 16 disposed furthest therefrom. Thus, in addition to defining opposed, generally planar top and bottom surfaces 38, 39, the generally quadrangular package body 36 further defines three generally planar side surfaces 40, an opposed pair of which extend in substantially flush relation to respective ones of the longitudinally extending peripheral edge segments 14 of the flexible substrate 12, with the remaining side surface 40 extending in substantially flush relation to that laterally extending peripheral edge segment 16 disposed furthest from the fold line FL.

Figure 4:
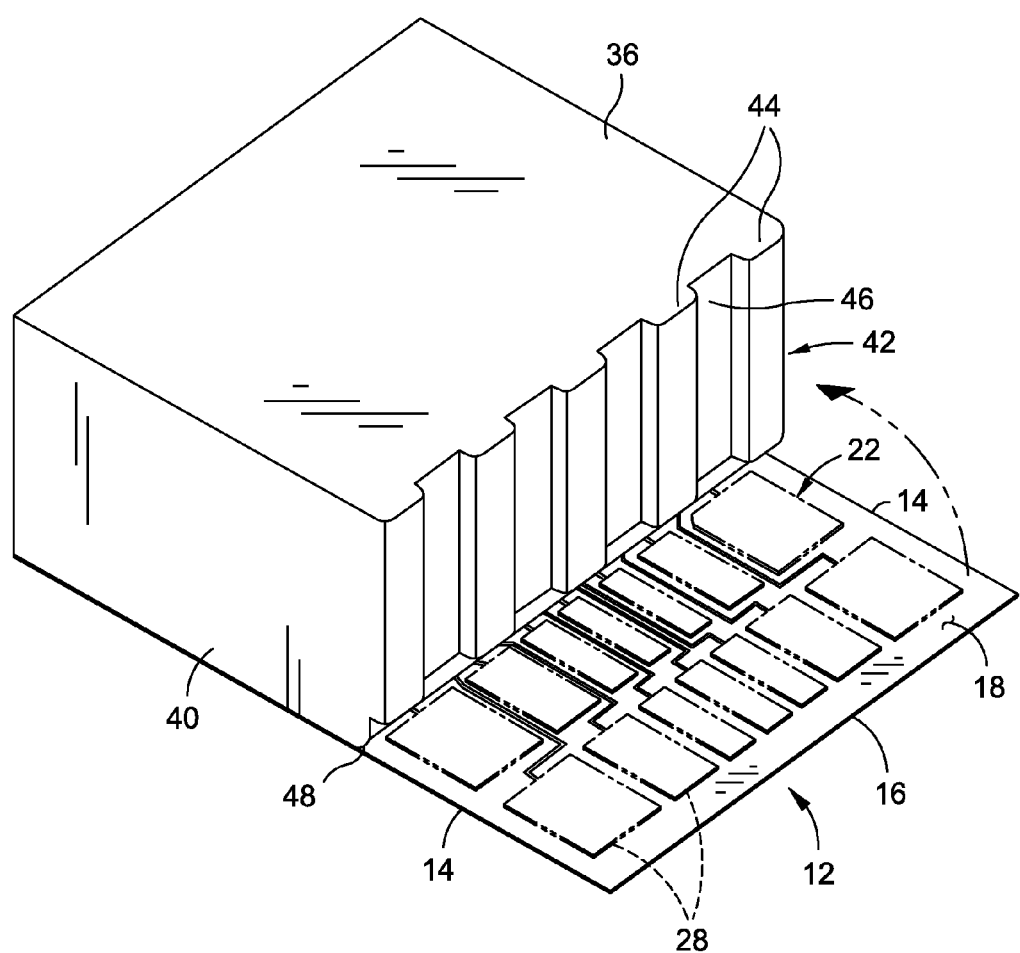
FIG. 4 is a top perspective view of the semiconductor package of the present invention, the flexible substrate being shown as having the package body of the semiconductor package formed thereon, but prior to the folding of the flexible substrate around a portion of the package body.

In addition to the three generally planar side surfaces 40 which each extend in generally perpendicular relation to the top surface 38, the package body 36 defines a fourth side surface 42 which also extends generally perpendicularly relative to the top surface 38. However, rather than extending in substantially flush relation to one of the longitudinally or laterally extending peripheral edge segments 14, 16, the side surface 42 extends to approximately the fold line FL defined by the flexible substrate 12. Additionally, in contrast to the side surfaces 40 which are each generally planar, the side surface 42 includes a plurality of relief features 44 formed thereon. As best seen in FIG. 4, the relief features 44 protrude outwardly from the side surface 42, and extend generally perpendicularly relative to the top surface 38 in spaced, generally parallel relation to each other. In FIG. 4, five (5) relief features 44 are shown as being formed on the side surface 42, with the outermost pair of the relief features 44 extending to respective ones of the opposed pair of the side surfaces 40 extending in substantially flush relation to respective ones of the longitudinally extending peripheral edge segments 14 of the flexible substrate 12. However, those of ordinary skill in the art will recognize that fewer or greater than five relief features 44 may be formed on the side surface 42 in an arrangement differing from that shown in FIG. 4 without departing from the spirit and scope of the present invention. Due to the manner in which the relief features 44 are formed, each adjacent pair thereof is separated by a generally planar section 46 of the side surface 42.

As is further shown in FIG. 4 and as also seen in FIG. 1, the side surface 42 includes a generally convex, arcuate portion 48 which defines the transition between the bottom ends of the relief features 44 and the planar sections 46 of the side surface 42 extending therebetween, and the first surface 18 of the flexible substrate 12. Thus, the arcuate portion 46 of the side surface 42 spans the entire width thereof extending between the longitudinally extending peripheral edge segments 14 of the flexible substrate 12. The use of the arcuate portion 46 of the side surface 42 will be discussed below. Though not shown, it is contemplated that the package body 36 may alternatively be formed to have a generally quadrangular, frame-like configuration defining an open interior cavity in which at least portions of the first surface 18, the electronic components 32, and/or the wires 34 may be exposed. If fabricated to have such frame-like configuration, it is contemplated that the package body 36 will still define the aforementioned side surfaces 40, 42, as well as the relief features 44, planar sections 46 and arcuate portion 46 also described above. Thus, this alternative version of the package body 36 essentially comprises that which is shown in FIG. 4 as modified to include a generally quadrangular interior cavity which extends from the top surface 38 of the package body 36 to the first surface 18 of the flexible substrate 12.

In the semiconductor package 10, that portion of the flexible substrate 12 which does not include the package body 36 formed thereon, (i.e., the portion of the flexible substrate 12 extending between the folded line FL and the laterally extending peripheral edge segment 16 disposed closest thereto) is folded so as to extend along and cover the outermost surfaces defined by the relief features 44 in the manner best shown in FIG. 2. In addition, such folded portion of the flexible substrate 12 is adhesively secured to and covers the arcuate portion 48 of the side surface 42, and the planar sections 46 thereof extending between the relief features 44. More particularly, as is best shown in FIGS. 1 and 2, an adhesive layer 50 is interposed between the planar sections 46 and arcuate portion 48 of the side surface 42, and that portion of the first surface 18 of the flexible substrate 12 which extends between the fold line FL and the laterally extending peripheral edge segment 16 disposed closest thereto. Advantageously, the relief features 44 against which portions of the first surface 18 of the folded section of the flexible substrate 12 are abutted assists in maintaining control over the thickness of the adhesive layer 50.

In the completed semiconductor package 10, that portion of the flexible substrate 12 which is folded and extends generally between the fold line FL and the laterally extending peripheral edge segment 16 disposed closest thereto extends generally perpendicularly (i.e., at approximately a 90° angle) relative to that portion of the flexible substrate 12 extending between the fold line FL and that laterally extending peripheral edge segment 16 disposed furthest therefrom. Since they are originally formed on that portion of the second surface 20 extending between the fold line FL and the laterally extending peripheral edge segment 16 disposed closest thereto, the conductive terminals 28 of the flexible substrate 12 are thus caused to assume an orientation essentially overlapping the side surface 42 when the flexible substrate 12 is folded and adhesively secured to the side surface 42 of the package body 36 in the aforementioned manner. Thus, as opposed to overlapping the bottom surface 39 of the package body 36 as would occur in a more traditional semiconductor package design, the conductive terminals 28 overlap one of the four side surfaces of the package body 36, and in particular the side surface 42 as explained above. Such overlap makes the semiconductor package 10 suitable for edge mounting in a vertical mount or orientation.

Figure 5A:
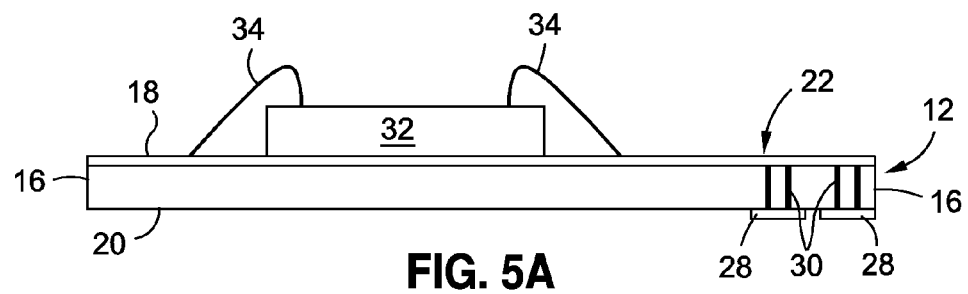
FIGS. 5A-5D illustrate an exemplary sequence of steps which may be used to facilitate the fabrication of the semiconductor package shown in FIGS. 1 and 2.
Figure 5B:
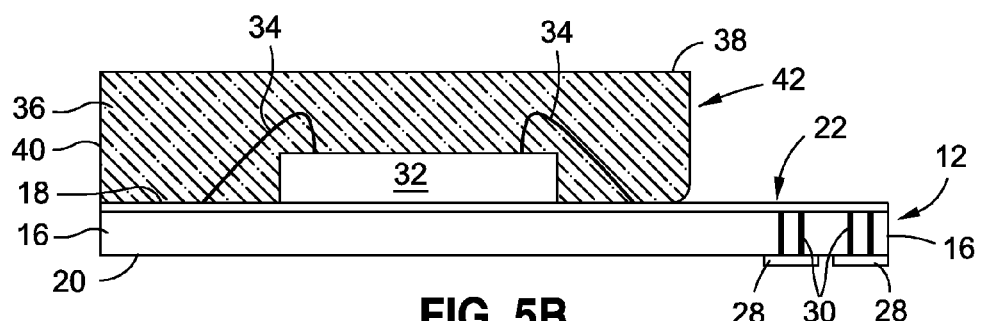

Referring now to FIGS. 5A-5D, there is shown an exemplary sequence of steps which may be used to facilitate the fabrication of the semiconductor package 10 shown in FIGS. 1 and 2. In the initial step of the fabrication sequence shown in FIG. 5A, the electronic component(s) 32 are mounted to the first surface 18 of the flexible substrate 12, and electrically connected to the conductive pattern 22 through the use of the conductive wires 34 in the same manner described above. Thereafter, as shown in FIG. 5B, the package body 36 is formed to cover the electronic component(s) 32 and conductive wires 34, the package body 34 being formed to have the structural attributes and to cover that portion of the flexible substrate 12 as also described above.

Figure 5C:
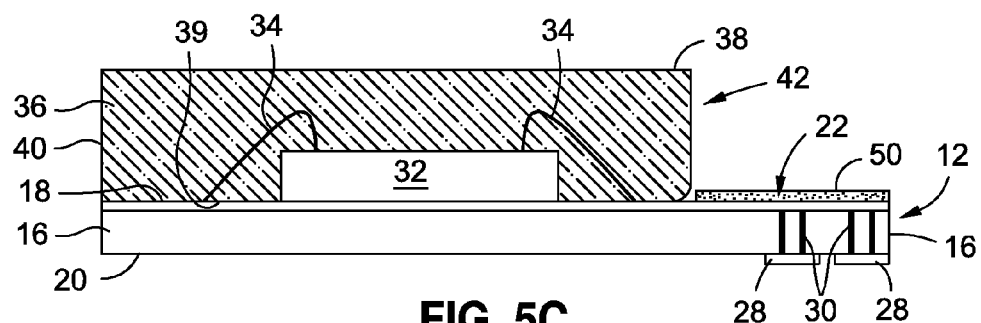
Figure 5D:
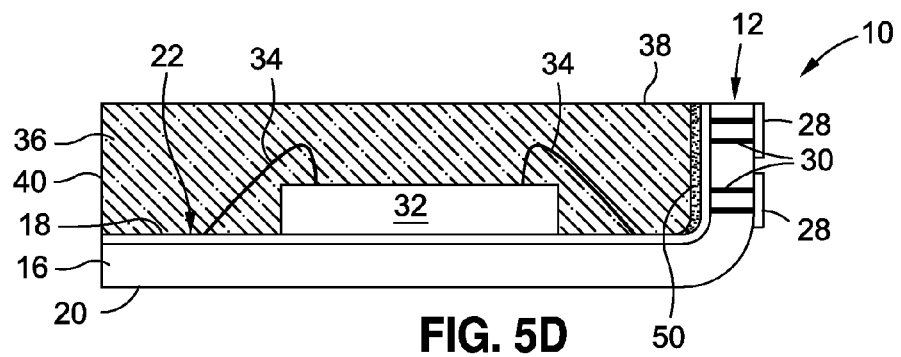

Referring now to FIG. 5C, subsequent to the formation of the package body 36, the adhesive layer 50 is initially dispensed onto that portion of the first surface 18 of the flexible substrate 12 which is not covered by the package body 36, i.e., that portion of the first surface 18 extending between the fold line FL and that laterally extending peripheral edge segment 16 disposed closest thereto. Thereafter, as seen in FIG. 5D, the flexible substrate 12 is folded along the fold line FL so as to cause the portion thereof disposed between the fold line FL and the laterally extending peripheral edge segment 16 disposed closest thereto to extend along an be adhered to the side surface 42 of the package body 36. As previously explained, upon such folding of the flexible substrate 12, the adhesive layer 50 is cause to flow between the folded portion of the inner surface 18 and the arcuate portion 48 of the side surface 42, the adhesive layer 50 further flowing between the folded portion of the inner surface 18 and the planar sections 46 of the side surface 42 extending between the relief features 44.

Referring now to FIGS. 6A-6E, there is further shown an exemplary sequence of steps which may be used to facilitate the simultaneous fabrication of multiple semiconductor packages 10. In the initial step of the mass fabrication process shown in FIG. 6A, an elongate strip 52 of flex tape is provided, the strip 52 essentially comprising a plurality of the above-described flexible substrates 12 in an integrally connected state. In this regard, the strip 52 includes a multiplicity of the conductive patterns 22 formed on the top surface thereof in a prescribed arrangement. Similarly, the strip 52 includes a multiplicity of the above-described conductive terminals 28 formed on the bottom surface thereof in a prescribed arrangement. More particularly, the conductive terminals 28 are arranged on the bottom surface of the strip 52 so as to be segregated into sets or groups which are electrically connected to respective ones of the conductive patterns 22 on the opposite top surface by corresponding conductive vias 30 extending through the strip 52. As is further shown in FIG. 6A, in the initial step of the mass fabrication process, a multiplicity of the electronic components 32 are mounted to the top surface of the strip 52, and electrically connected to corresponding ones of the conductive patterns 22 through the use of the above-described conductive wires 34.

Figure 6A:
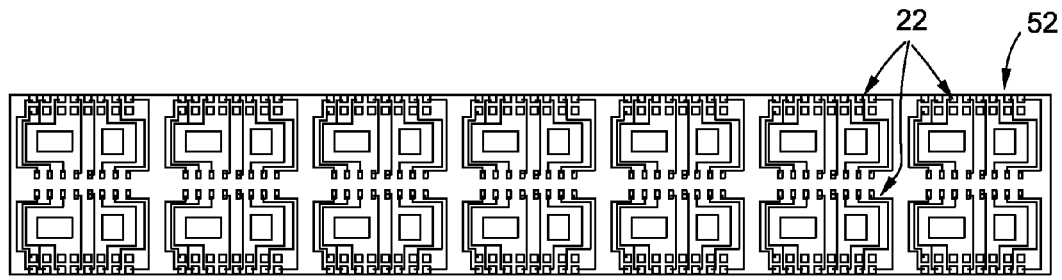
FIGS. 6A-6E illustrate an exemplary sequence of steps which may be used to facilitate the simultaneous fabrication of multiple semiconductor packages as shown in FIGS. 1 and 2.
Figure 6B:
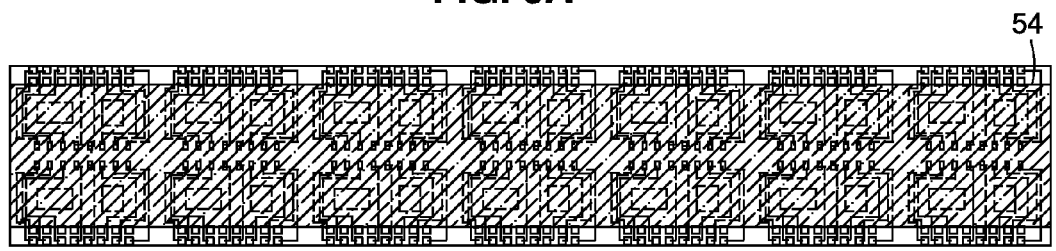

In the next step of the mass fabrication process shown in FIG. 6B, a mold cap 54 is applied to the top surface of the strip 52 so as to cover each of the electronic components 32 and conductive wires 34 disposed on the top surface of the strip 52. As shown in FIG. 6B, portions of the top surface of the strip 52 extending along each of the opposed, longitudinally extending peripheral edge segments of the strip 52 are not covered by the mold cap 54. In this regard, the width of each of the exposed portions of the top surface of the strip 52 minors the width of each flexible substrate 12 between the fold line FL and the laterally extending peripheral edge segment 16 of the flexible substrate 12 disposed closest to the fold line FL. As will be recognized, each segregated set of the conductive terminals 28 formed on the bottom surface of the strip 52 is oriented so as to be disposed in opposed relation to a portion of the top surface of the strip 52 which is not covered by the mold cap 54.

Figure 6C:
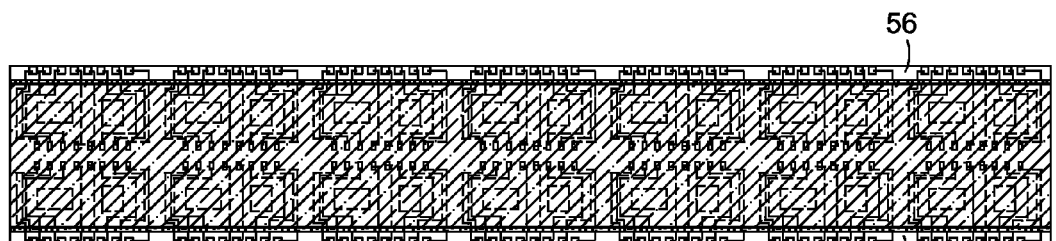
Figure 6D:
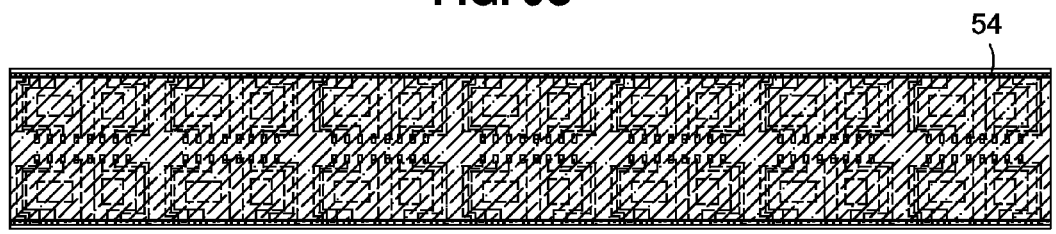
Figure 6E:
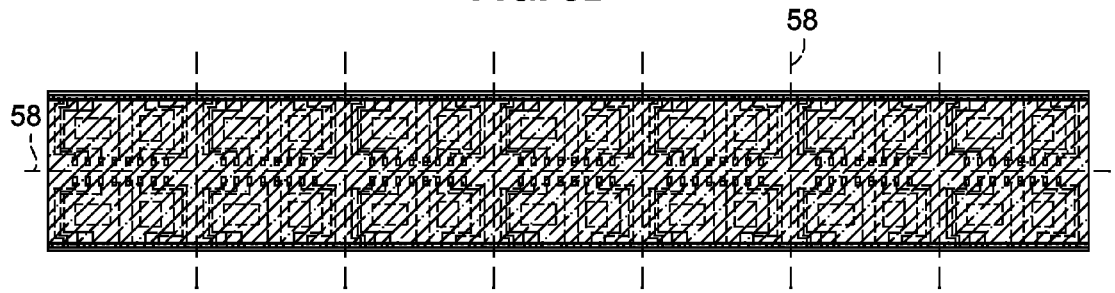

Referring now to FIG. 6C, in the next step of the mass fabrication process for the semiconductor packages 10, adhesive layers 56 are dispensed upon or applied to those portions of the top surface of the strip 52 which are not covered by the mold cap 54. Thereafter, as shown in FIG. 6D, those portions of the strip 52 protruding from the mold cap 54 and having the adhesive layers 56 applied thereto are bent so as to be adhesively secured to respective ones of the opposed, longitudinally extending side surfaces defined by the mold cap 54. Though not shown in FIG. 6D, it is contemplated that such longitudinally extending side surfaces defined by the mold cap 54 will have the above-described relief features 44 formed thereon in a prescribed arrangement, and further each be formed to define a continuous, convex portion which extends along the bottom thereof. Upon the curing of the adhesive layers 56, the strip 52 and mold cap 54 are subjected to a cutting or singulation process in accordance with the pattern provided by the saw street 58 shown in FIG. 6E. As will be recognized, the completion of this singulation process effectively forms the individual semiconductor packages 10, each of which has the aforementioned structural features. In this regard, the singulated mold cap 54 ultimately forms the individual package bodies 36 of the semiconductor packages 10, with the singulated strip 52 forming the flexible circuits 12 thereof. Those of ordinary skill in the art will recognize that the aforementioned fabrication process, and in particular the method used to facilitate the formation of the mold cap 54, may be varied from that described above in the event that the package body 36 of each resultant semiconductor package 10 is to have the alternative, frame-like configuration also described above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a flexible substrate having a conductive pattern and a plurality of conductive terminals disposed thereon, the terminals being electrically connected to the conductive pattern;
   at least one electronic component mounted to the substrate and electrically connected to the conductive pattern; and
   a package body formed on a portion of the flexible substrate and covering the electronic component mounted thereto, the package body defining top and bottom surfaces, and multiple side surfaces which extend between the top and bottom surfaces;
   the flexible substrate being folded in a manner wherein only the bottom surface and one side surface of the package body are at least partially covered thereby, and the terminals are exposed and positioned so as to overlap the side surface which is at least partially covered by the flexible substrate.

2. The semiconductor package of claim 1 wherein the bottom surface and one side surface of the package body are completely covered by the folded flexible substrate.

3. The semiconductor package of claim 1 wherein the folded flexible substrate defines an interior first surface which is at least partially covered by the package body and has the conductive pattern disposed thereon and the electronic component mounted thereto, and an exterior second surface which has the terminals disposed thereon.

4. The semiconductor package of claim 3 wherein, the package body defines a generally convex, arcuate portion which defines the transition between the bottom surface and the side surface which is at least partially covered by the flexible substrate, the arcuate portion also being at least partially covered by the flexible substrate.

5. The semiconductor package of claim 3 wherein the side surface of the package body which is at least partially covered by the flexible substrate includes at least one relief feature which protrudes therefrom and is also at least partially covered by the flexible substrate.

6. The semiconductor package of claim 5 wherein the side surface of the package body which is at least partially covered by the flexible substrate includes a plurality of relief features which protrude therefrom and extend in spaced relation to each other.

7. The semiconductor package of claim 3 wherein:
   the package body defines a generally convex, arcuate portion which defines the transition between the bottom surface and the side surface which is at least partially covered by the flexible substrate; and the side surface of the package body which is at least partially covered by the flexible substrate includes at least one relief feature which protrudes therefrom and extends between the top surface and the arcuate portion;
the arcuate portion and the relief feature also being at least partially covered by the flexible substrate.

8. The semiconductor package of claim 7 wherein the side surface of the package body which is at least partially covered by the flexible substrate includes a plurality of relief features which protrude therefrom and extend in spaced relation to each other.

9. The semiconductor package of claim 3 wherein the conductive pattern comprises a combination of conductive pads which are electrically connected to the electronic component, and a plurality of conductive traces which are electrically connected to and extend between the pads and respective ones of the terminals.

10. The semiconductor package of claim 9 wherein the electronic component is electrically connected to the pads of the conductive pattern by a plurality of conductive wires which are covered by the package body.

11. The semiconductor package of claim 1 wherein the at least one electronic component comprises two or more electronic components.

12. The semiconductor package of claim 11 wherein each of the electronic components is electrically connected to the conductive pattern by a plurality of conductive wires which are covered by the package body.

13. The semiconductor package of claim 11 wherein the two or more electronic components are disposed in side-by-side relation to each other.

14. A semiconductor package comprising:
a flexible substrate including a plurality of conductive terminals disposed thereon;
at least one electronic component attached to the substrate and electrically connected to the conductive terminals thereof; and
a package body formed on a portion of the flexible substrate and covering the electronic component mounted thereto;
the flexible substrate being folded in a manner wherein only two surfaces of the package body which are separated by an angle of approximately ninety degrees are at least partially covered thereby, and the terminals are exposed and positioned so as to overlap one of the surfaces of the package body which are at least partially covered by the flexible substrate.

15. The semiconductor package of claim 14 wherein the folded flexible substrate defines an interior first surface which is at least partially covered by the package body and has the electronic component mounted thereto, and an exterior second surface which has the terminals disposed thereon.

16. The semiconductor package of claim 15 wherein the package body defines a generally convex, arcuate portion which defines the transition between the two surfaces which are at least partially covered by the flexible substrate, the arcuate portion also being at least partially covered by the flexible substrate.

17. The semiconductor package of claim 15 wherein one of the two surfaces of the package body which is at least partially covered by the flexible substrate includes at least one relief feature which protrudes therefrom and is also at least partially covered by the flexible substrate.

18. The semiconductor package of claim 15 wherein:
the package body defines a generally convex, arcuate portion which defines the transition between the two surfaces which are at least partially covered by the flexible substrate; and
one of the two surfaces of the package body which is at least partially covered by the flexible substrate includes at least one relief feature which protrudes therefrom;
the arcuate portion and the relief feature also being at least partially covered by the flexible substrate.

19. The semiconductor package of claim 18 wherein the at least one relief feature comprises a plurality of relief features which extend in spaced relation to each other.

20. A semiconductor package comprising:
a flexible substrate including a plurality of conductive terminals disposed thereon;
at least one electronic component attached to the substrate and electrically connected to the conductive terminals thereof; and
a package body formed on a portion of the flexible substrate and covering the electronic component mounted thereto;
the flexible substrate being folded in a manner wherein only two surfaces of the package body which do not extend in co-planar relation to each other are at least partially covered thereby, and the terminals are exposed and positioned so as to overlap one of the surfaces of the package body which are at least partially covered by the flexible substrate.

* * * * *